US010460065B1

(12) United States Patent
Liu et al.

(10) Patent No.: US 10,460,065 B1
(45) Date of Patent: Oct. 29, 2019

(54) ROUTING TOPOLOGY GENERATION USING SPINE-LIKE TREE STRUCTURE

(71) Applicant: Cadence Design Systems, Inc., San Jose, CA (US)

(72) Inventors: Wen-Hao Liu, Cedar Park, TX (US); Wing-Kai Chow, Austin, TX (US); Gracieli Posser, Austin, TX (US); Mehmet Can Yildiz, Austin, TX (US); Zhuo Li, Austin, TX (US); Charles Jay Alpert, Cedar Park, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 285 days.

(21) Appl. No.: 15/649,426

(22) Filed: Jul. 13, 2017

(51) Int. Cl.
*G06F 17/50* (2006.01)

(52) U.S. Cl.
CPC .................. *G06F 17/5077* (2013.01)

(58) Field of Classification Search
USPC ........................................................ 716/126
See application file for complete search history.

(56) References Cited

U.S. PATENT DOCUMENTS

| 2006/0288323 | A1* | 12/2006 | Birch | ................. | G06F 17/5077 716/129 |
| 2015/0100938 | A1* | 4/2015 | Lu | ...................... | G06F 17/5077 716/131 |

* cited by examiner

*Primary Examiner* — Eric D Lee
(74) *Attorney, Agent, or Firm* — Schwegman Lundberg & Woessner, P.A.

(57) ABSTRACT

Aspects of the present disclosure address improved systems and methods for routing topology generation. More specifically, the present disclosure addresses systems and methods for generating a routing topology using a spine-like tree structure. Consistent with some embodiments, given a Steiner-tree based routing topology as input, the system performs an iterative refinement process on the tree topology where at least a portion of subtrees are converted to spine subtrees as the system traverses the nodes of the tree in a particular traversal order. This process continues until all tree nodes have been processed. The result is a refined routing topology that has a spine-like structure.

20 Claims, 10 Drawing Sheets

ROUTING TOPOLOGY GENERATION USING SPINE-LIKE TREE STRUCTURE

TECHNICAL FIELD

The present disclosure generally relates to the technical field of integrated circuit design. In particular, the present disclosure addresses systems and methods for generating a routing topology for integrated circuit designs.

BACKGROUND

An integrated circuit (IC) comprises cells of similar and/or various sizes, and connections between or among the cells. A cell includes several pins interconnected by wires to pins of one or more other cells. A net includes a set of pins connected by wires in order to form connections between or among the pins. A set of nets, called a netlist, defines the connections of an IC. In other words, a netlist specifies a group of nets, which, in turn, specify the interconnections between a set of pins.

Design engineers design IC's by transforming circuit descriptions of the IC's into geometric descriptions, called layouts. To create layouts, design engineers typically use electronic design automation (EDA) applications. These applications provide sets of computer-based tools for creating, editing, and analyzing IC design layouts.

EDA applications create layouts by using geometric shapes that represent different materials and devices on IC's. For instance, EDA tools commonly use rectilinear lines to represent the wire segments that interconnect the IC components. These tools also represent electronic and circuit IC components as geometric objects with varying shapes and sizes.

The IC design process entails various operations. Some of the physical-design operations that EDA applications commonly perform to obtain the IC layouts are: (1) circuit partitioning, which partitions a circuit if the circuit is too large for a single chip; (2) floor planning, which finds the alignment and relative orientation of the circuit modules; (3) placement, which determines more precisely the positions of the circuit components; (4) routing, which completes the interconnects between or among the circuit components; and (5) verification, which checks the layout to ensure that it meets design and functional requirements.

Routing is a key operation in the physical design cycle. It is generally divided into two phases: global routing and detailed routing. For each net, global routing generates a routing topology that includes an approximate route for the interconnect lines that are to connect the pins of the net. After the routing topology has been created, detailed routing creates specific individual routing paths for each net.

Traditional routing algorithms adopt a flat framework that finds paths for nets in the whole routing region directly. The Steiner-tree approach is an example of a traditional routing algorithm. With the Steiner-tree approach, a minimum rectilinear Steiner tree (MRST) is used for routing a multi-pin net with minimum wire length. Given m points in the plane, an MRST connects all points by rectilinear lines, possibly via some extra points (called Steiner points), to achieve a minimum-wire-length tree of rectilinear edges. Although the Steiner-tree approach generates routing topologies that are optimized for wire length (e.g., in which routing paths use the minimum possible wire length), the Steiner-tree approach does not optimize the distance from source to sink. Thus, the Steiner-tree approach fails to address potential time delay issues that may be caused by excessive distances between source and sink, and as a result, the performance of the resulting IC may suffer.

Further, due to the large number of nets in the netlist, it typically takes a long time for conventional routers to finish the connection task. In addition, the connections may be too numerous and/or overcrowded, such that conventional routers fail to finish the routing, particularly generating interconnections, without creating one or more design rule violations.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Aspects of the present disclosure include systems and methods for routing topology generation. More specifically, the present disclosure addresses systems and methods for generating a routing topology using a spine-like tree structure. The tree structure is "spine-like" in that it is a hybridization of a spine tree and a tree structure included in an initial routing topology such as a tree generated based on the Steiner-tree approach (referred to as a "Steiner tree"). Thus, the tree structure is not a pure spine tree; rather, portions of the tree (e.g., subtrees) may have a spine-tree structure while other portions maintain the structure from the initial routing topology (e.g., a Steiner-tree structure).

Consistent with some example embodiments, given a Steiner tree as input, the system determines a traversal order for the tree nodes (e.g., the breadth-first search order). Starting with the root node of the tree, the system performs an iterative refinement process where subtrees (e.g., regions of the tree) are converted to spine subtrees as the system traverses the tree in the traversal order. In some embodiments, the system may also receive an adjustable tuning parameter as input. The tuning parameter controls the trade-off between the spine-tree structure and certain routing variables such as wire length.

For each traversed node, the system forms a node group that includes the current node and nodes connected to the current node. The system extracts an original subtree for the node group, in which the current node is the root node, and the system computes both a vertical and a horizontal subtree based on the original subtree. The system then evaluates the subtrees based on a routing score function that includes one or more routing score variables (e.g., wire length, power, or latency) and selects a subtree for the node group based on the evaluation. Depending on the subtree selected, the system may reconnect the nodes in the node group according to the selected subtree (e.g., either the horizontal or vertical subtree). This process continues until all tree nodes have been processed, and the result is a refined routing topology that has a spine-like structure.

Figure 1:
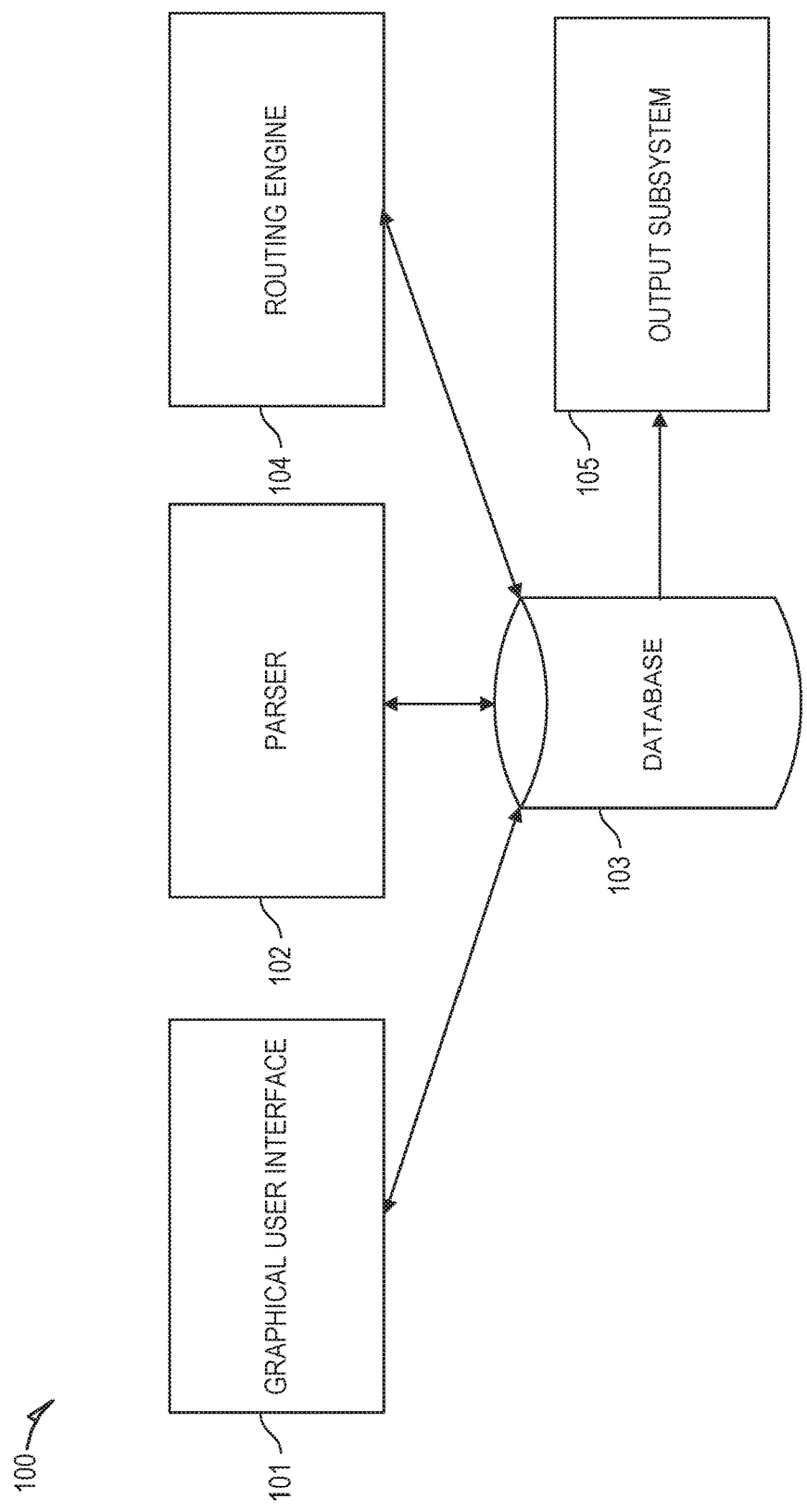
FIG. 1 is a block diagram illustrating a router system, according to some example embodiments.

With reference to FIG. 1, a router 100 is illustrated, according to some example embodiments. The router 100 comprises a graphical user interface (GUI) 101, a parser 102, a database 103, a routing engine 104, and an output subsystem 105. Any one or more of the functional components illustrated in FIG. 1 and described herein may be implemented using hardware (e.g., a processor of a machine) or a combination of hardware and software. For example, any one of the components described herein may configure a processor to perform the operations described herein for that component. Moreover, any two or more of these components may be combined into a single component, and the functions described herein for a single component may be subdivided among multiple components. Furthermore, according to various example embodiments, any of the functional components illustrated in FIG. 1 may be implemented together or separately within a single machine, database, or device or may be distributed across multiple machines, databases, or devices.

The GUI 101 is responsible for handling user interactions with the router 100. For example, the GUI 101 may allow a user to view wires generated by the router 100. The GUI 101 may also allow the user to view various information, such as routing tracks. The GUI 101 may also allow the user to interactively add and delete wires.

The parser 102 reads in IC designs stored in a file format, such as an industry standard format and/or a custom format. The cells and connections are entirely or partly described in IC designs. Once some embodiments of the present disclosure finish routing, the generated wires will be output into the files as well. The database 103 stores the IC design information as well as wires in a compact and efficient manner. The routing engine 104 generates wires (which are then stored in the database 103) that interconnect the nets of an IC design in accordance with the netlist of the IC design. The output subsystem 105 outputs the wiring and other useful information into files of a standard and/or custom format.

Figure 2:
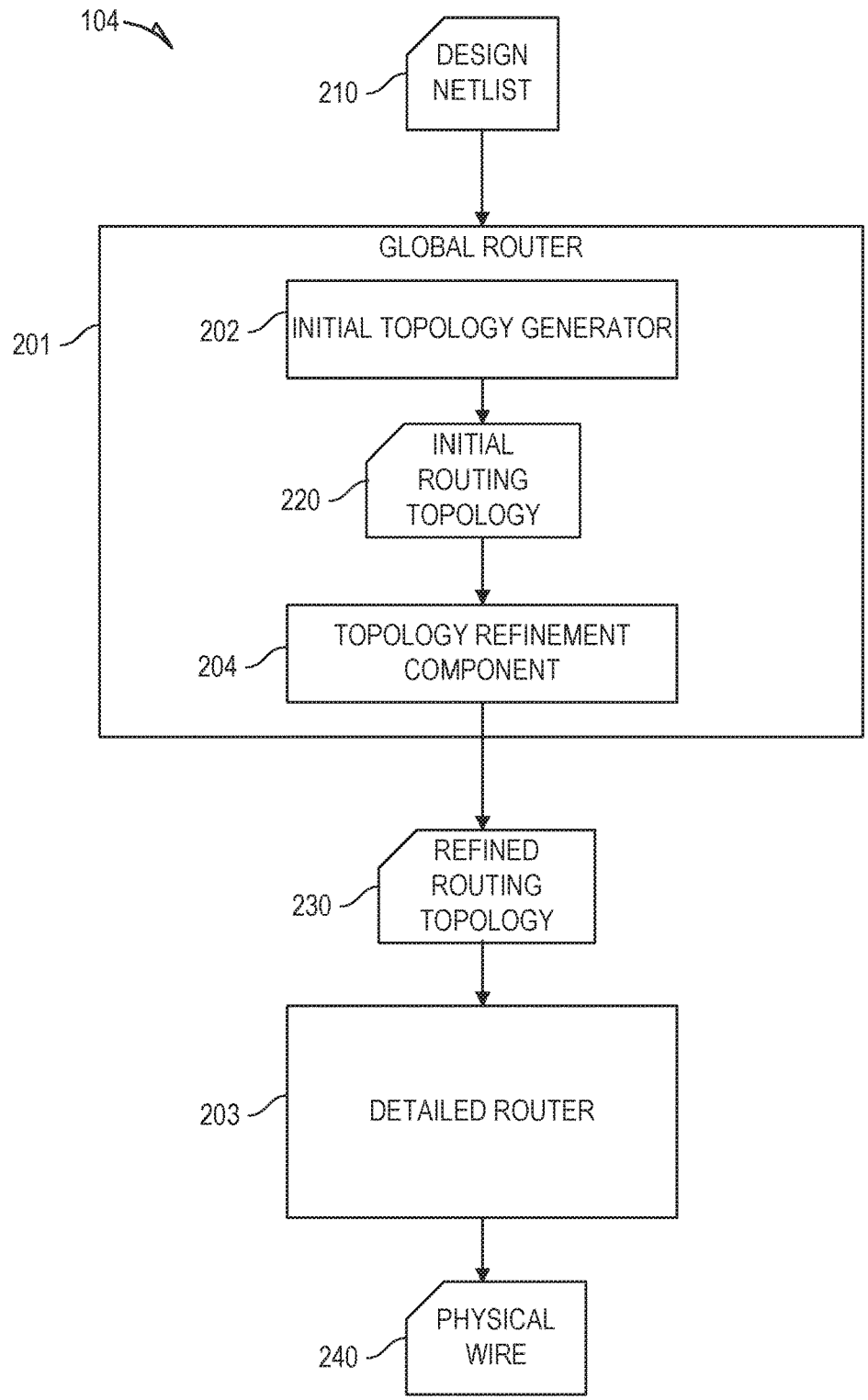
FIG. 2 is a block diagram illustrating functional components of a routing engine, which is provided as part of the router system, according to some example embodiments.

Referring now to FIG. 2, functional components of the routing engine 104 are illustrated, in accordance with some embodiments. To avoid obscuring the inventive subject matter with unnecessary detail, various functional components (e.g., modules, engines, and databases) that are not germane to conveying an understanding of the inventive subject matter have been omitted from FIG. 2. However, a skilled artisan will readily recognize that various additional functional components may be supported by the routing engine 104 to facilitate additional functionality that is not specifically described herein.

Further, any one or more of the functional components illustrated in FIG. 2 and described herein may be implemented using hardware (e.g., a processor of a machine) or a combination of hardware and software. For example, any one of the components described herein may configure a processor to perform the operations described herein for that component. Moreover, any two or more of these components may be combined into a single component, and the functions described herein for a single component may be subdivided among multiple components. Additionally, according to various example embodiments, any of the functional components illustrated in FIG. 2 may be implemented together or separately within a single machine, database, or device or may be distributed across multiple machines, databases, or devices.

As shown, the routing engine 104 comprises a global router 201 and a detailed router 203. The global router 201 is responsible for determining an approximate routing path for wires connecting each net in accordance with a design netlist 210 in a process referred to by those of ordinary skill in the art as "global routing." In doing so, the global router 201 may construct multiple levels, each with a global routing grid covering the entire IC design of one or more layers. At any one moment, only a portion, such as an area of one or more partitions, of the design may be routed; therefore, much less memory and run time are required. In addition, since the routing task has been divided, multi-threaded parallelism can be applied to speed up the global router 201.

As shown, the global router 201 receives a design netlist 210 as input. An initial topology generator 202 of the global router 201 processes the design netlist 210 to generate an initial routing topology 220 that includes a routing path for each net in the IC design that connects the net's routable elements. Each routing path may include multiple connections, each of which represents a wire that connects two pins. The routing topology 220 includes a topological graph that represents the IC design layout topologically. The topological graph may include a tree structure that includes several topological items including nodes that represent the pins in each net as well as the connections between each pin. The topological graph may further include a grid structure (also referred to as a "grid graph) superimposed over the tree structure. The grid structure comprises a plurality or perpendicular lines that form a plurality of grid cells.

Consistent with some embodiments, the initial topology generator 202 generates the initial routing topology 220, for example, based on a Steiner-tree approach. With the Steiner-tree approach, a minimum rectilinear Steiner-tree (MRST) is used for routing a multi-pin net with minimum wire length. Given m points in the plane, an MRST connects all points by rectilinear lines, possibly via some extra points (called Steiner points), to achieve a minimum wire length tree of rectilinear edges, thereby reducing power dissipation and thus power consumption of the integrated circuit. It shall be approached that the Steiner-tree approach is merely an example of the routing performed by the global router 201, and in other embodiments, the global router 201 may utilize one of several known global routing techniques. For example, in some embodiments, the global router 201 may generate the initial routing topology 220 based on a spine-tree approach. With the spine-tree approach, the global router 201 generates a connection network with a horizontal or vertical wire called a spine that spans across all pins in the net either horizontally or vertically. Every pin is then connected to the spine directly with the shortest wire possible.

While the Steiner-tree approach may produce routing topologies that are optimized for wire length, the Steiner-tree approach does not optimize for time delay (e.g., based on distance from source to sink). For example, with the Steiner-tree approach routing paths between the source node to the sink node may include several bends. Bending creates many issues in timing-critical routing because due to the unidirectional nature of the routing layer. Thus, routing segments in different directions (horizontal or vertical) are placed on different layers. Connections between routing segments of different layers usually have higher resistance than normal wire and as a result, may cause higher signal delay.

Figure 3:
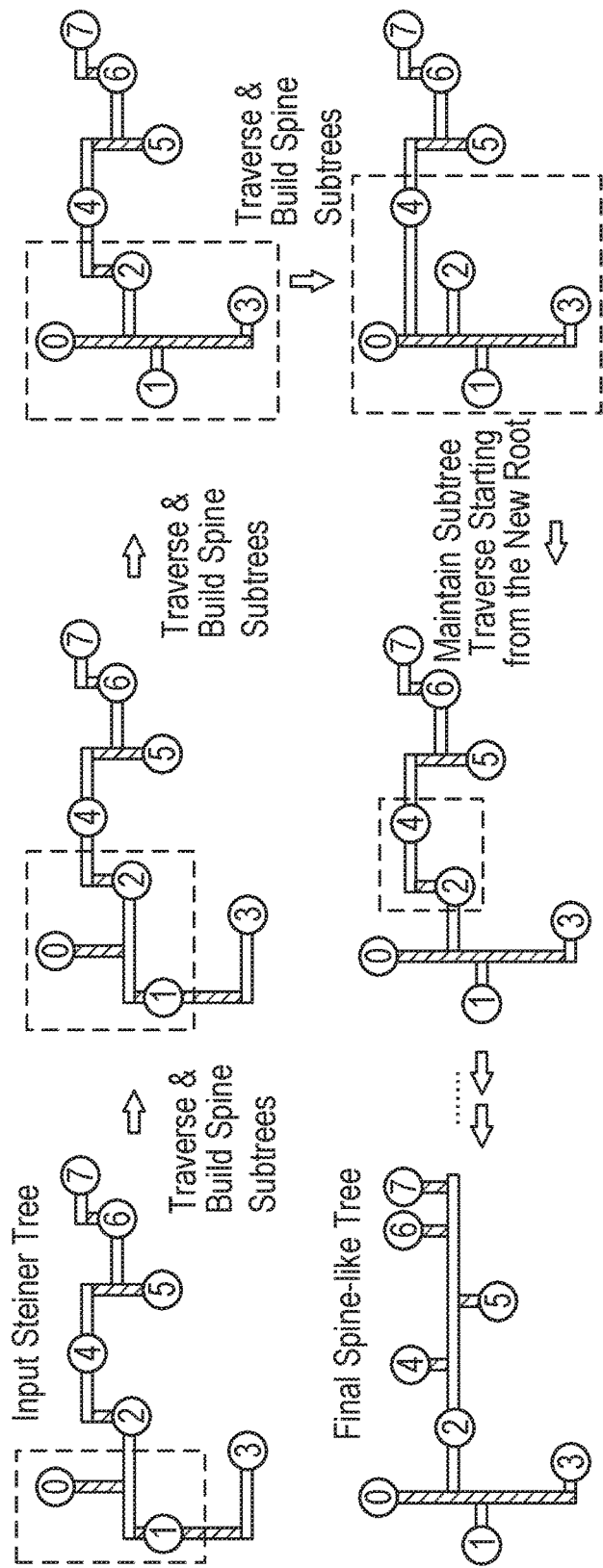
FIG. 3 is a conceptual diagram illustrating a high-level overview of a routing topology generation method performed by the routing engine, according to some example embodiments.
Figure 4:
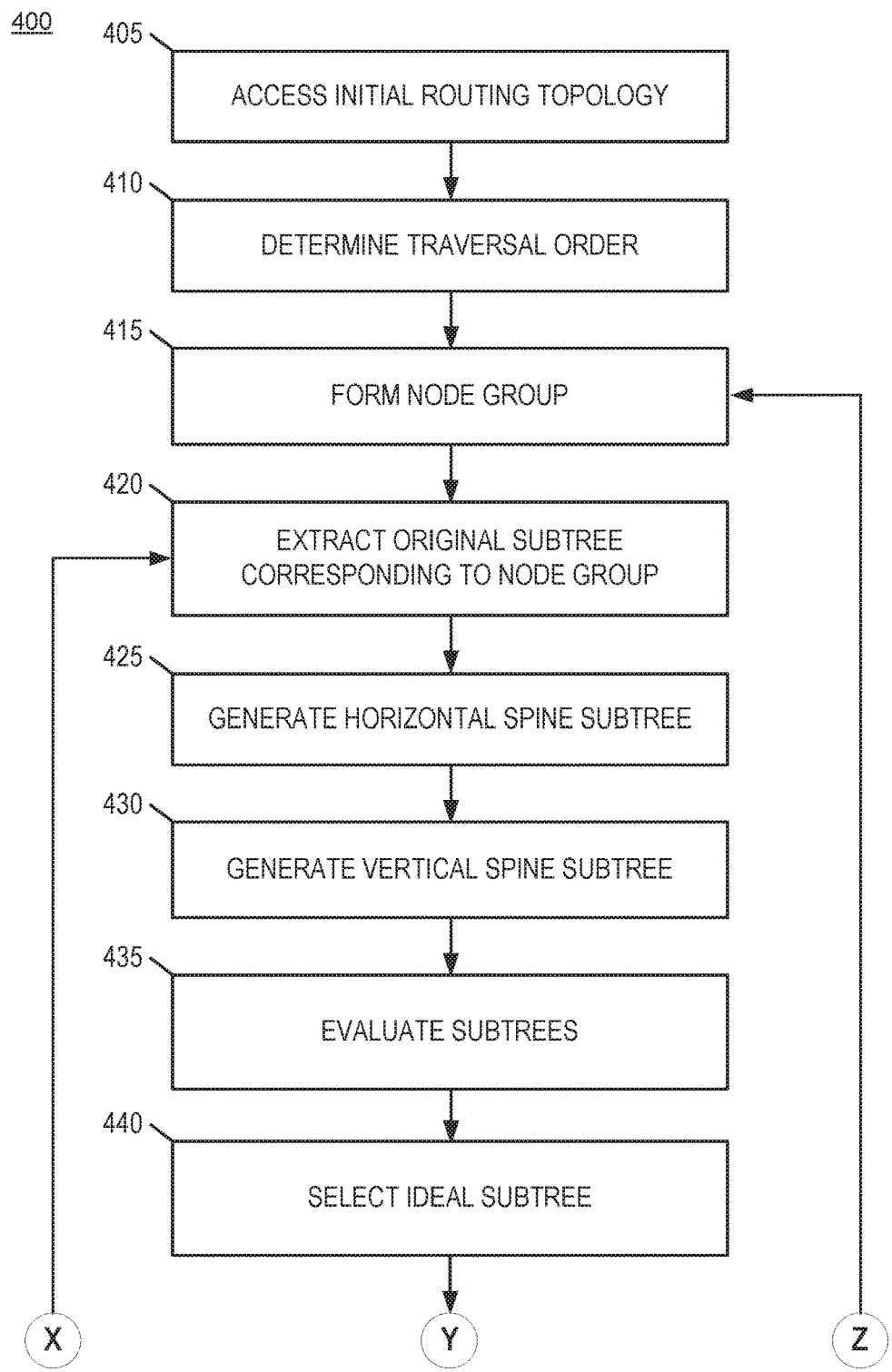
FIGS. 4-7 are flowcharts illustrating operations of the routing engine in performing a method for routing topology generation, according to some example embodiments.

To address potential signal delay issues caused by the Steiner-tree approach, the global router 201 includes a topology refinement component 204 that refines the initial routing topology 220 to produce a refined routing topology 230 that is optimized to reduce total wire length. As an example, FIG. 3 illustrates a high-level overview of the process employed by the topology refinement component 204 in refining the initial routing topology 220 produced by the global router 201, according to a specific example. Initially, the topology refinement component 204 accesses the initial routing topology 220, which, in this example, is generated based on the Steiner-tree approach.

As shown, the topology refinement component 204 traverses the tree in a top-down manner to convert various subtrees (e.g., portions of the tree) of the Steiner tree into spine subtrees. More specifically, for each node traversed in the tree, the topology refinement component 204 generates a horizontal and a vertical spine subtree based on the original subtree (e.g., a portion of the overall tree in which the current node is the root node), and compares the original subtree, the horizontal spine subtree, and the vertical spine subtree to identify the optimal configuration in light of a routing score function that includes one or more routing score variables (e.g., a minimum or maximum wire length or latency). The "routing score function" may also be referred to by one of ordinary skill in the art as a "routing cost function" or simply as a "cost function."

The topology refinement component 204 selects the optimal subtree based on the comparison, and may convert the subtree based on the selection. For example, if the horizontal spine subtree has the smallest wire length, the topology refinement component 204 converts the original subtree to the horizontal spine subtree. However, if the original subtree has a shorter wire length than both the vertical and horizontal subtrees, the original subtree is maintained and the topology refinement component 204 traverses to the parent of the current node, and the process is continued. Once the topology refinement component 204 traverses the entire tree, the refined routing topology 230, which includes a hybridization of a Steiner and spine tree referred to as a "spine-like" tree, is output.

Returning to FIG. 2, the refined routing topology 230 is passed to the detailed router 203, which generates physical wires 240 that realize the refined routing topology 230. To generate the physical wires 240 that realize the refined routing topology 230, the detailed router 203 routes the complete design by dividing the entire design into a set of smaller areas and/or partitions. Consistent with some embodiments, the detailed router 203 can route these areas in parallel utilizing multi-threaded parallel computing capabilities. In other embodiments, the detailed routing can be single-threaded all or some of the time, and/or multi-threaded all or some of the time.

FIGS. 4-7 are flowcharts illustrating operations of the router 100 in performing a method 400 for routing topology generation, according to some example embodiments. The method 400 may be embodied in computer-readable instructions for execution by one or more processors such that the operations of the method 400 may be performed in part or in whole by the routing engine 104; accordingly, the method 400 is described below by way of example with reference thereto. However, it shall be appreciated that at least some of the operations of the method 400 may be deployed on various other hardware configurations, and the method 400 is not intended to be limited to the routing engine 104.

At operation 405, the topology refinement component 204 accesses the initial routing topology 220 of an IC design. The initial routing topology 220 may be generated by the global router 201 in accordance with the Steiner-tree approach. Accordingly, the initial routing topology 220 comprises a Steiner-tree structure having a plurality of interconnected nodes.

At operation 410, the topology refinement component 204 determines a traversal order of nodes in the tree structure. The traversal order may, for example, correspond to the breadth-first search (BFS) traversal order.

At operation 415, the topology refinement component 204 forms a node group comprising a set of nodes that includes a root node and one or more nodes connected to the root node. Initially, the root node is the first node in the traversal order, but as the topology refinement component 204 iterates through the method 400, the root node in the node group at each iteration may be the current node in the traversal of the tree depending on the outcome of downstream operations. Further, the forming of the node group may include adding and/or removing one or more nodes from the node group of the previous iteration of the method 400. For example, in iterations of operation 415 that are subsequent to the first node in the traversal order, the forming of the node group may include replacing the previous root node with the current node, adding the parent node of the current node (if not already included in the node group, e.g., because it is the previous node in the traversal order), removing one or more parent nodes of the previous root node in the traversal order, and adding the node that is subsequent to the root node in the traversal order.

At operation 420, the topology refinement component 204 extracts, from the tree structure, a subtree corresponding to the node group (hereinafter referred to as the "original subtree"). The original subtree corresponds to a portion (e.g., a subset) of the tree structure in which the current node is the root node. The original subtree includes the set of nodes of the node group.

At operation 425, the topology refinement component 204 generates a horizontal spine subtree based on the original subtree. Further details regarding the generation of the horizontal spine subtree are discussed below in reference to FIG. 6.

At operation 430, the topology refinement component 204 generates a vertical spine subtree based on the original subtree. Further details regarding the generation of the vertical spine subtree are discussed below in reference to FIG. 7.

At operation 435, the topology refinement component 204 evaluates the original subtree, the vertical spine subtree, and the horizontal spine subtree in accordance with a routing score function that includes one or more routing score variables. The one or more routing score variables may, for example, include wire length, power, and latency. In evaluating the subtrees in accordance with the routing score function, the topology refinement component 204 computes a routing score value for each of the subtrees. Depending on the one or more routing score variables, the routing score value may correspond to a wire length, a power value, or a latency of the subtree.

In an example where the one or more routing score variables include wire length, the evaluation of the original subtree, the vertical spine subtree, and the horizontal spine subtree includes determining a wire length of the original subtree, determining a wire length of the vertical spine subtree, determining a wire length of the horizontal spine subtree, and comparing the wire lengths to determine the minimum possible wire length for the node group.

In an example where the one or more routing score variables include latency, the evaluation of the original subtree, the vertical spine subtree, and the horizontal spine subtree includes determining a latency of the original subtree, determining a latency of the vertical spine subtree, determining a latency of the horizontal spine subtree, and comparing the latencies to determine the minimum possible latency for the node group.

In some embodiments, the routing score function may also include a tuning parameter to control the trade-off between wire length and spine-tree structure. The tuning parameter may, for example, be supplied by a user using the GUI 101. In these embodiments, the tuning parameter is included in the determination of the routing score value for the original subtree. For example, in accordance with these embodiments, the topology refinement component 204 may calculate the routing score value by computing the product (i.e., the result of multiplication) of the wire length of the original subtree and the tuning parameter. In this way, the tuning parameter may be used to control the trade-off between spine-like structure and score variables such as wire length.

At operation 440, the topology refinement component 204 selects an ideal subtree from the original subtree, the vertical spine subtree, and the horizontal spine subtree based on a result of the evaluating. For purposes of the present disclosure, the "ideal" subtree is the subtree having the lowest routing score value. Following the example of wire length from above, the topology refinement component 204 selects the subtree with the shortest wire length as the ideal subtree. Following the example of latency from above, the topology refinement component 204 selects the subtree with the lowest latency as the ideal subtree.

Figure 5:
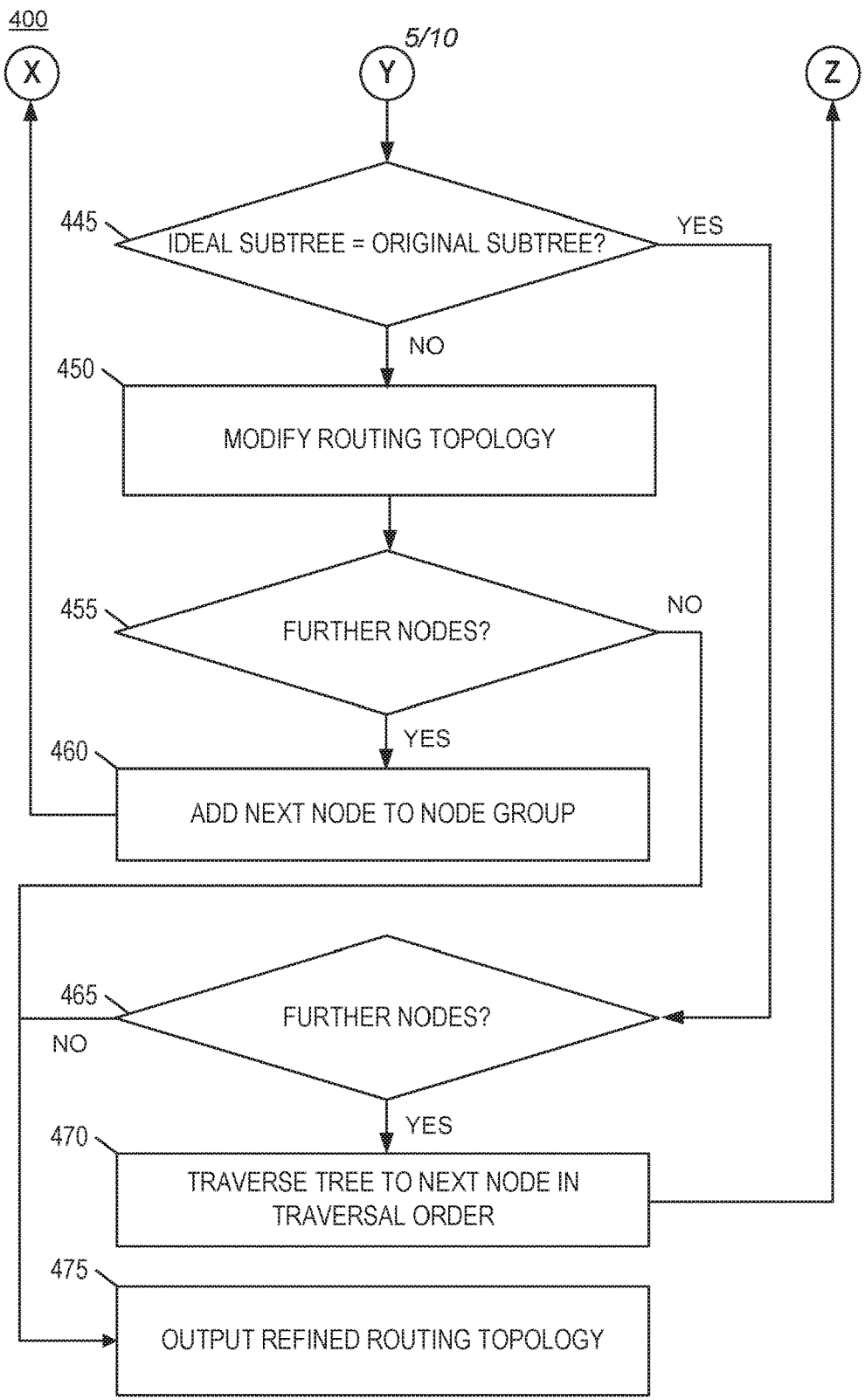

With reference to FIG. 5, at operation 445, the topology refinement component 204 determines whether the ideal subtree is the original subtree. If the ideal subtree is different from the original subtree (i.e., the ideal subtree is either the horizontal or vertical spine subtree), at operation 450, the topology refinement component 204 modifies the routing topology in accordance with the ideal subtree. In modifying the routing topology, the topology refinement component 204 converts the original subtree to the ideal subtree (e.g., by reconnecting the nodes of the node group in accordance with the ideal subtree). At operation 455, the topology refinement component 204 determines whether there are further nodes remaining in the tree structure. If there are further nodes remaining in the tree structure, the topology refinement component 204, at operation 460, adds the next node in the traversal order to the node group formed at operation 415, and the method returns to operation 420 where the topology refinement component 204 extracts the original subtree for the node group that now includes the next node in the traversal order.

If, at operation 455, the topology refinement component 204 determines there are no further nodes in the tree structure, the method proceeds to operation 475, which is described below.

Returning to operation 445, if the ideal subtree is the original subtree, the original subtree is maintained and the method 400 proceeds to operation 465. At operation 465, the topology refinement component 204 determines whether there are further nodes remaining in the tree structure. If there are further nodes remaining in the tree structure, the topology refinement component 204, at operation 470, traverses the tree structure to the next node in the traversal order. The method 400 then returns to operation 415, where the process described above is repeated for the next node in the traversal order, and the process is repeated until each node in the tree structure has been processed. In other words, the method 400 is iteratively repeated for each node in the tree structure and in an order dictated by the traversal order.

Once all nodes in the tree structure have been processed, the result is the refined routing topology 230. The method 400 then proceeds to operation 475, where the topology refinement component 204 outputs the refined routing topology 230 to the detailed router 203 for use in the detailed routing phase. In some instances, rather than providing the refined routing topology 230 directly to the detailed router 203, the topology refinement component 204 may store the refined routing topology 230 in the database 103 for subsequent retrieval by the detailed router 203.

Figure 6:
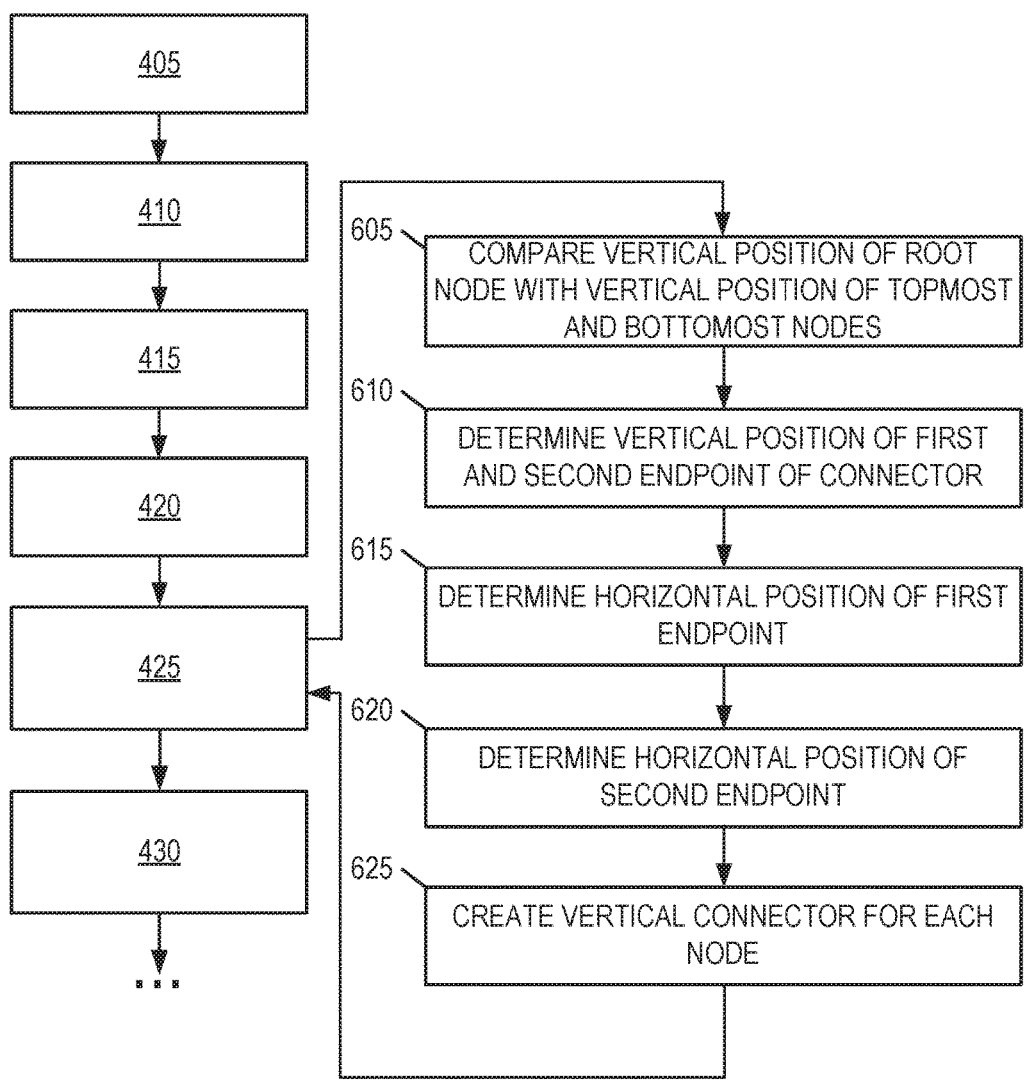

As shown in FIG. 6, the method 400 may include operations 605, 610, 615, 620, and 625. In some example embodiments, the operations 605, 610, 615, 620, and 625 included in the method 400 may be performed as part (e.g., a subroutine or sub-operation) of operation 425, where the topology refinement component 204 generates a horizontal spine subtree based on the original subtree. In the following description, various node positions are discussed. In this context, these positions may correspond to coordinate values (e.g., x, y) within a coordinate system.

At operation 605, the topology refinement component 204 compares a vertical position (e.g., a y-coordinate value) of the root node with vertical positions (e.g., y-coordinate values) of a topmost and a bottommost node in the original subtree. The comparing of the vertical position of the root node with the vertical positions of the topmost and the bottommost nodes in the original subtree includes determining whether the vertical position of the topmost node is the same as the vertical position of the root node, and determining whether the vertical position of the bottommost node is the same as the vertical position of the root node.

At operation 610, the topology refinement component 204 determines a vertical position (e.g., y-coordinate value) of a first and second endpoint of a spine connector based on a result of the comparing. More specifically, if the vertical position of the topmost node is the same as the vertical position of the root node, the topology refinement component 204 sets the vertical position of the first and second endpoints of the spine connector as the vertical position of the second topmost node. If the vertical position of the topmost node is not the same as the vertical position of the root node and if the vertical position of the bottommost node is the same as the vertical position of the root node, the topology refinement component 204 sets the vertical position of the first and second endpoints of the spine connector as the vertical position of the second bottommost node.

Otherwise, the topology refinement component 204 sets the vertical position of the first and second endpoints of the spine connector as the vertical position of the root node.

At operation 615, the topology refinement component 204 determines a horizontal position (e.g., x-coordinate value) of the first endpoint of the spine connector based on a horizontal position (e.g., x-coordinate value) of a rightmost node in the original subtree. More specifically, the topology refinement component 204 sets the horizontal position (e.g., x-coordinate value) of the first endpoint of the spine connector as the horizontal position of the rightmost node in the original subtree.

At operation 620, the topology refinement component 204 determines a horizontal position (e.g., x-coordinate value) of the second endpoint of the spine connector based on a horizontal position (e.g., x-coordinate value) of a leftmost node in the original subtree. More specifically, the topology refinement component 204 sets the horizontal position (e.g., x-coordinate value) of the second endpoint of the spine connector as the horizontal position of the leftmost node in the original subtree.

At operation 625, the topology refinement component 204 creates one or more vertical connectors to connect each node of the set of nodes to the spine connector. The result of the operation 625 is the horizontal spine subtree.

Figure 7:
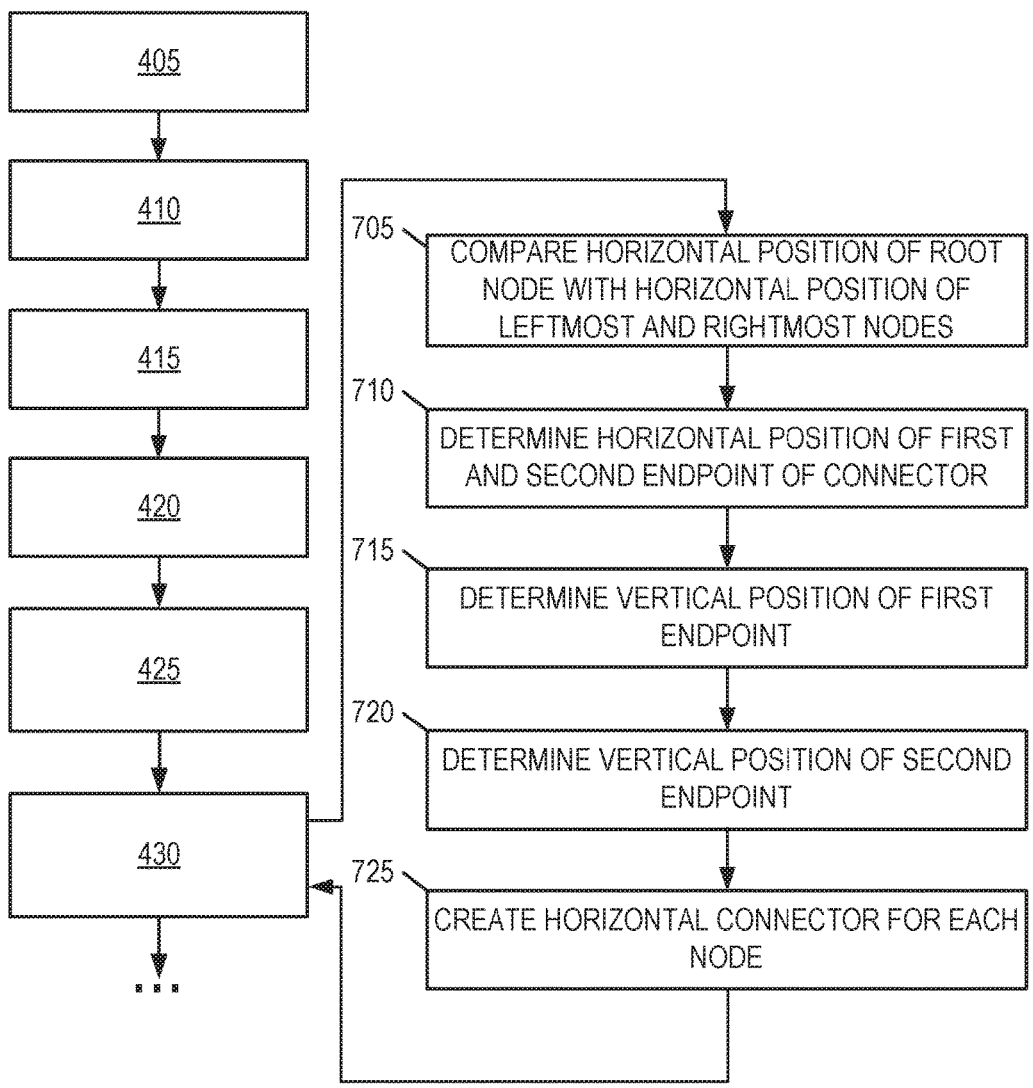

As shown in FIG. 7, the method 400 may include operations 705, 710, 715, 720, and 725. In some example embodiments, the operations 705, 710, 715, 720, and 725 included in the method 400 may be performed as part (e.g., a subroutine or sub-operation) of operation 430, where the topology refinement component 204 generates a vertical spine subtree based on the original subtree. In the following description, various node positions are discussed. In this context, these positions may correspond to coordinate values (e.g., x, y) within a coordinate system.

At operation 705, the topology refinement component 204 compares a horizontal position (e.g., x-coordinate value) of the root node with horizontal positions (e.g., x-coordinate values) of a rightmost and a leftmost node in the original subtree. The comparing of the horizontal position of the root node with the horizontal positions of the rightmost and the leftmost nodes in the original subtree includes determining whether the horizontal position of the rightmost node is the same as the horizontal position of the root node, and determining whether the horizontal position of the leftmost node is the same as the horizontal position of the root node.

At operation 710, the topology refinement component 204 determines a horizontal position (e.g., x-coordinate value) of a first and second endpoint of a spine connector based on a result of the comparing. More specifically, if the horizontal position of the leftmost node is the same as the horizontal position of the root node, the topology refinement component 204 sets the horizontal position of the first and second endpoints of the spine connector as the horizontal position of the second leftmost node. If the horizontal position of the leftmost node is not the same as the horizontal position of the root node and if the horizontal position of the rightmost node is the same as the horizontal position of the root node, the topology refinement component 204 sets the horizontal position of the first and second endpoints of the spine connector as the horizontal position of the second rightmost node. Otherwise, the topology refinement component 204 sets the horizontal position of the first and second endpoints of the spine connector as the horizontal position of the root node.

At operation 715, the topology refinement component 204 determines a vertical position (e.g., y-coordinate value) of the first endpoint of the spine connector based on a vertical position (e.g., y-coordinate value) of a topmost node in the original subtree. More specifically, the topology refinement component 204 sets the vertical position (e.g., y-coordinate value) of the first endpoint of the spine connector as the vertical position of the topmost node in the original subtree.

At operation 720, the topology refinement component 204 determines a vertical position (e.g., y-coordinate value) of the second endpoint of the spine connector based on a vertical position (e.g., y-coordinate value) of a bottommost node in the original subtree. More specifically, the topology refinement component 204 sets the vertical position (e.g., y-coordinate value) of the second endpoint of the spine connector as the vertical position of the bottommost node in the original subtree.

At operation 725, the topology refinement component 204 creates one or more horizontal connectors to connect each node of the set of nodes to the spine connector. The result of the operation 725 is the vertical spine subtree.

Figure 8A:
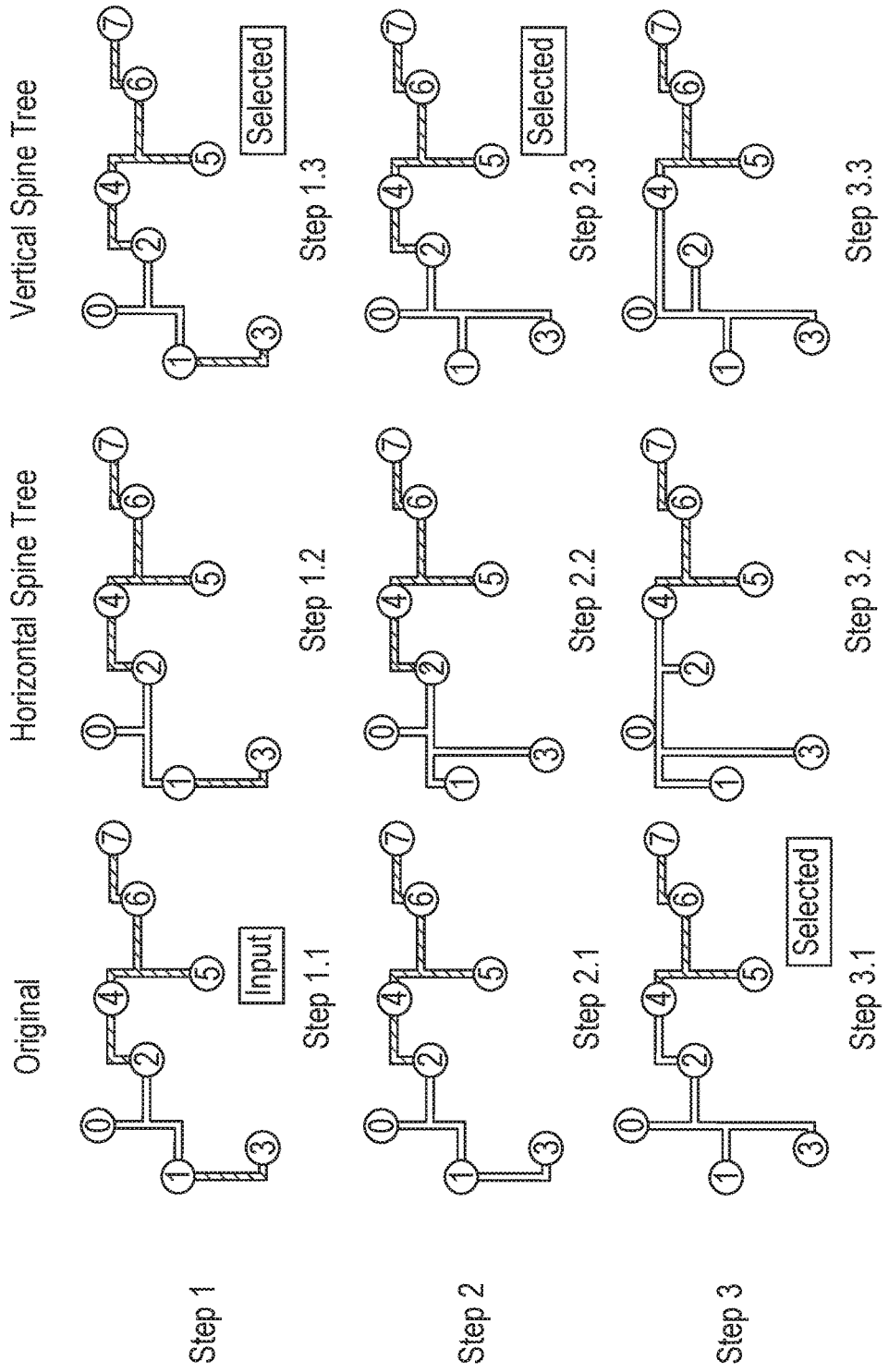
FIGS. 8A and 8B are conceptual diagrams that graphically illustrate operation of the method for routing topology generation on an initial routing topology, according to some example embodiments.
Figure 8B:
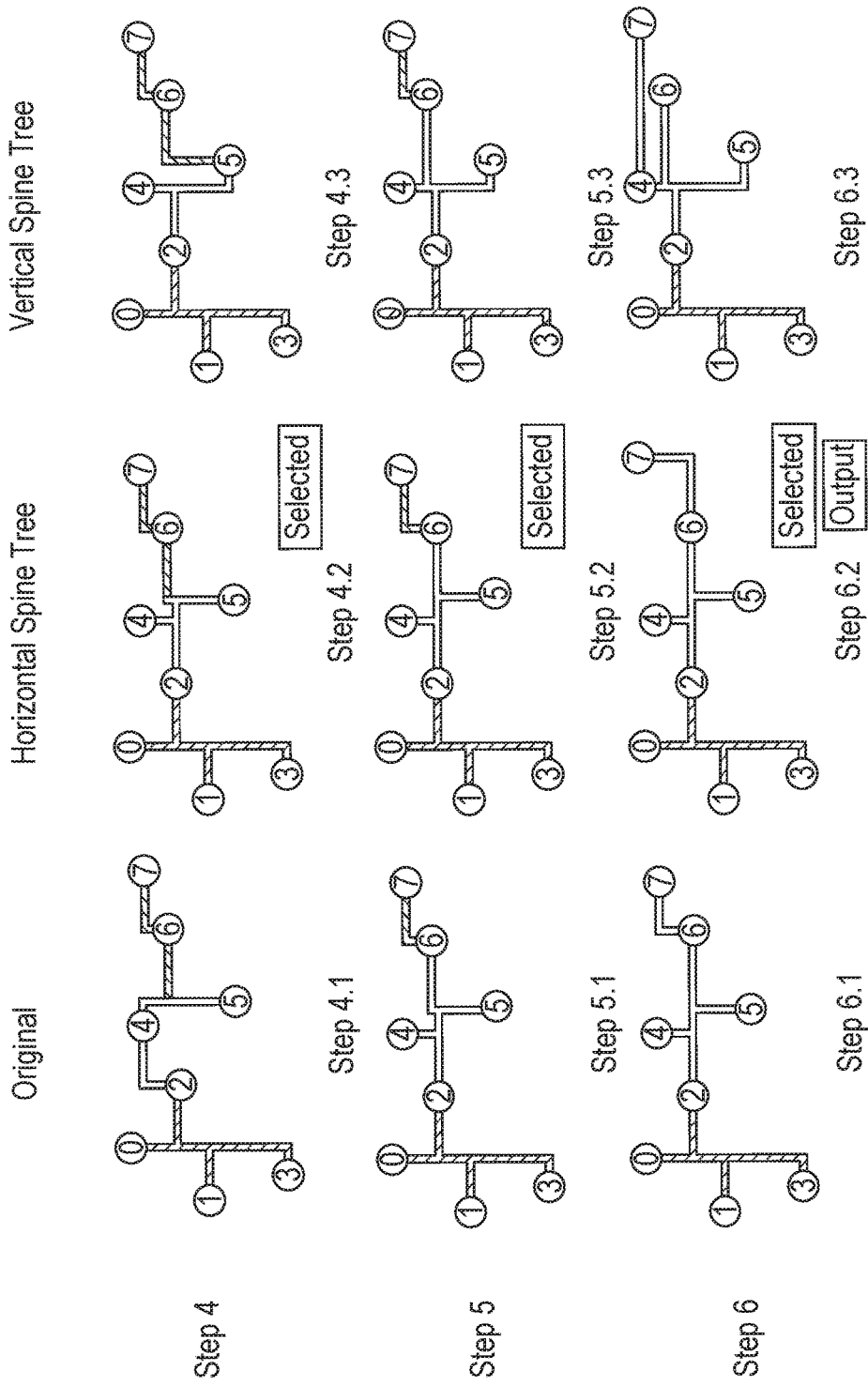

FIGS. 8A and 8B are conceptual diagrams that graphically illustrate operation of the method 400 for routing topology generation on a routing topology. As shown at step 1, each node in the initial routing topology is labeled in accordance with a traversal order. At step 1, an original subtree is extracted for a first node group (step 1.1) comprising nodes 0-2; a horizontal spine subtree is created for the first node group (step 1.2); a vertical spine subtree is created for the first node group (step 1.3); and the vertical spine subtree (created at step 1.3) is selected as the ideal subtree and is used to replace the original subtree in the routing topology.

As shown in step 2, the original subtree extracted at step 1.1 has been replaced with the vertical spine subtree created at step 1.3. Upon replacing the original subtree from step 1.1 with the vertical spine subtree from step 1.3, the topology refinement component 204 proceeds to step 2, where an original subtree is extracted for a second node group (step 2.1) comprising nodes 0-3; a horizontal spine subtree is created for the second node group (step 2.2); a vertical spine subtree is created for the second node group (step 2.3); and the vertical spine subtree is selected as the ideal subtree to replace the original subtree extracted at step 2.1.

As shown in step 3, the original subtree for the second node group extracted at step 2.1 has been replaced with the vertical spine subtree created at step 2.3. Upon replacing the original subtree extracted at step 2.1 with the vertical spine subtree created at step 2.3, the topology refinement component 204 proceeds to step 3, where an original subtree is extracted for a third node group (step 3.1) comprising nodes 0-4; a horizontal spine subtree is created for the third node group (step 3.2); a vertical spine subtree is created for the third node group (step 3.3); and the original subtree extracted at step 3.1 is selected as the ideal subtree.

With reference to FIG. 8B, as shown in step 4, the original subtree extracted from the third node group at step 3.1 has been maintained in the routing topology. Upon selecting the original subtree extracted at step 3.1 as the ideal subtree for the third node group, the topology refinement component 204 proceeds to step 4, where an original subtree is extracted for a fourth node group comprising nodes 2, 4, and 5 (step 4.1); a horizontal spine subtree is created for the fourth group (step 4.2); a vertical spine subtree is created for the fourth node group (4.3); and the horizontal spine subtree created at step 4.2 is selected as the ideal subtree to replace the original subtree extracted at step 4.1.

As shown in step 5, the original subtree extracted at step 4.1 has been replaced with the horizontal spine subtree created at step 4.2. Upon replacing the original subtree extracted at step 4.1 with the horizontal spine subtree created at 4.2, the topology refinement component 204 proceeds to step 5, where an original subtree is extracted for a fifth node group (step 5.1) comprising nodes 2 and 4-6; a horizontal spine subtree is created for the fifth node group (step 5.2); a vertical spine subtree is created for the fifth node group (step 5.3); and the horizontal spine subtree created at step 5.2 is selected as the ideal subtree to replace the original subtree extracted at step 5.1.

As shown in step 6, the original subtree extracted at step 5.1 has been replaced with the horizontal spine subtree created at step 5.2. Upon replacing the original subtree extracted at step 5.1 with the horizontal spine subtree created at step 5.2, the topology refinement component 204 traverses proceeds to step 6, where an original subtree is extracted for a sixth node group (step 6.1) comprising nodes 2, and 4-7; a horizontal spine subtree is created for the sixth node group (step 6.2); a vertical spine subtree is created for the sixth node group (step 6.3); and the horizontal spine subtree created at step 6.2 is selected as the ideal subtree to replace the original subtree extracted at step 6.1. The result of step 6 is a refined routing topology, which includes a spine-like tree structure. The refined routing topology may then be provided as output by the topology refinement component 204.

Electronic Apparatus and System

Example embodiments may be implemented in digital electronic circuitry, in computer hardware, firmware, or software, or in combinations of them. Example embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special-purpose logic circuitry (e.g., a field-programmable gate array (FPGA) or an application-specific integrated circuit (ASIC)).

Figure 9:
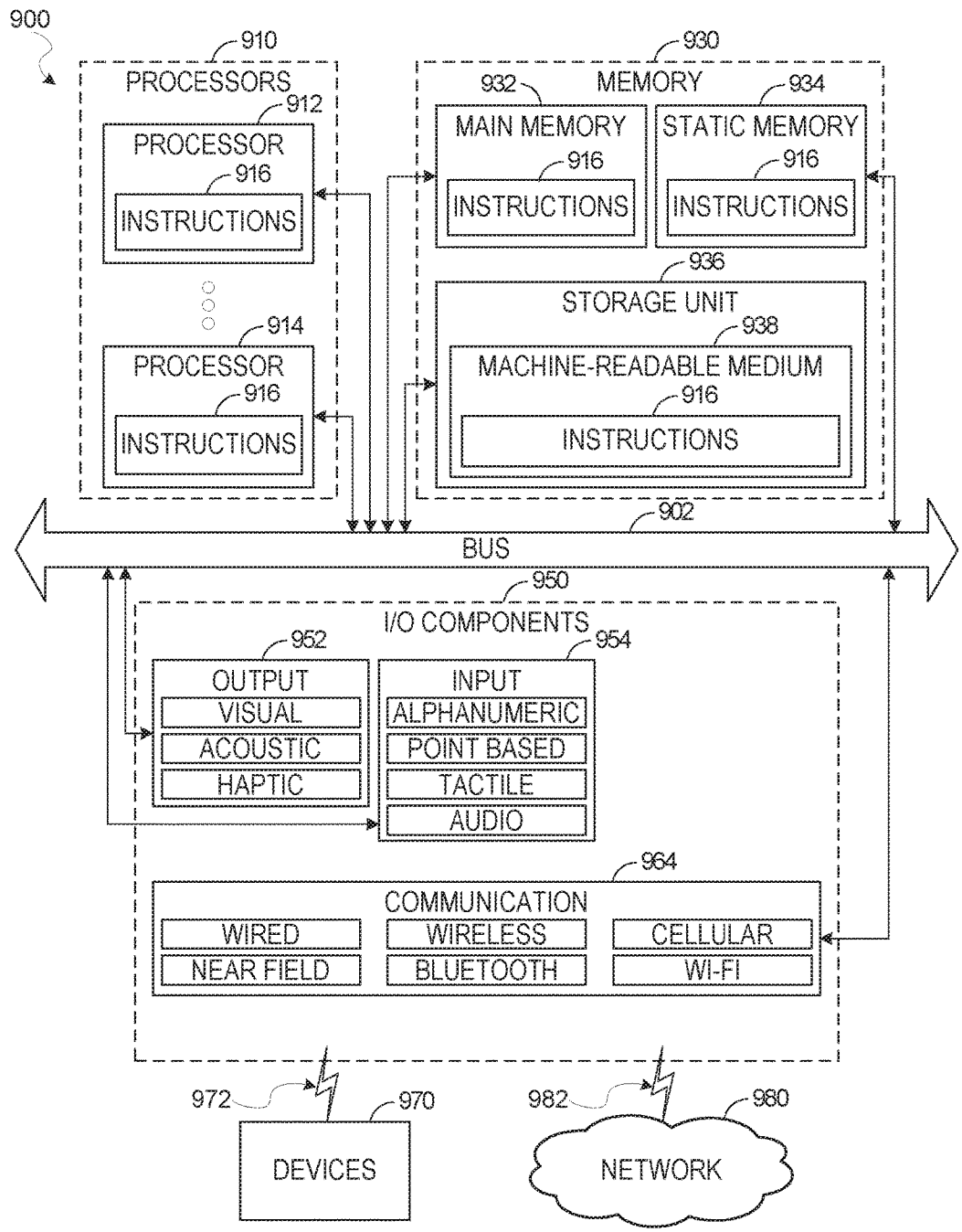
FIG. 9 is a diagrammatic representation of a machine in the example form of a computer system within which a set of instructions for causing the machine to perform any one or more of the methodologies discussed herein may be stored and executed.

FIG. 9 illustrates a diagrammatic representation of a machine 900 in the form of a computer system within which a set of instructions may be executed for causing the machine 900 to perform any one or more of the methodologies discussed herein, according to an example embodiment. Specifically, FIG. 9 shows a diagrammatic representation of the machine 900 in the example form of a computer system, within which instructions 916 (e.g., software, a program, an application, an applet, an app, or other executable code) for causing the machine 900 to perform any one or more of the methodologies discussed herein may be executed. For example, the instructions 916 may cause the machine 900 to execute the method 400. Additionally, or alternatively, the instructions 916 may implement FIGS. 1-3, 8A, and 8B. The instructions 916 transform the general, non-programmed machine 900 into a particular machine 900, such as the routing engine 104, programmed to carry out the described and illustrated functions in the manner described here. In alternative embodiments, the machine 900 operates as a standalone device or may be coupled (e.g., networked) to other machines. In a networked deployment, the machine 900 may operate in the capacity of a server machine or a client machine in a server-client network environment, or as a peer machine in a peer-to-peer (or distributed) network environment. The machine 900 may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 916, sequentially or otherwise, that specify actions to be taken by the machine 900. Further, while only a single machine 900 is illustrated, the term "machine" shall also be taken to include a collection of machines 900 that individually or jointly execute the instructions 916 to perform any one or more of the methodologies discussed herein.

The machine 900 may include processors 910, memory 930, and I/O components 950, which may be configured to communicate with each other such as via a bus 902. In an example embodiment, the processors 910 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) may include, for example, a processor 912 and a processor 914 that may execute the instructions 916. The term "processor" is intended to include multi-core processors 910 that may comprise two or more independent processors (sometimes referred to as "cores") that may execute instructions contemporaneously. Although FIG. 9 shows multiple processors, the machine 900 may include a single processor with a single core, a single processor with multiple cores (e.g., a multi-core processor), multiple processors with a single core, multiple processors with multiples cores, or any combination thereof.

The memory 930 may include a main memory 932, a static memory 934, and a storage unit 936, both accessible to the processors 910 such as via the bus 902. The main memory 932, the static memory 934, and the storage unit 936 store the instructions 916 embodying any one or more of the methodologies or functions described herein. The instructions 916 may also reside, completely or partially, within the main memory 932, within the static memory 934, within the storage unit 936, within at least one of the processors 910 (e.g., within the processor's cache memory), or any suitable combination thereof, during execution thereof by the machine 900.

The I/O components 950 may include a wide variety of components to receive input, provide output, produce output, transmit information, exchange information, capture measurements, and so on. The specific I/O components 950 that are included in a particular machine will depend on the type of machine. For example, portable machines such as mobile phones will likely include a touch input device or other such input mechanisms, while a headless server machine will likely not include such a touch input device. It will be appreciated that the I/O components 950 may include many other components that are not shown in FIG. 9. The I/O components 950 are grouped according to functionality merely for simplifying the following discussion, and the grouping is in no way limiting. In various example embodiments, the I/O components 950 may include output components 952 and input components 954. The output components 952 may include visual components (e.g., a display such as a plasma display panel (PDP), a light emitting diode (LED) display, a liquid crystal display (LCD), a projector, or a cathode ray tube (CRT)), acoustic components (e.g., speakers), other signal generators, and so forth. The input components 954 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 950 may include communication components 964 operable to couple the machine 900 to a network 980 or devices 970 via a coupling 982 and a coupling 972, respectively. For example, the communication components 964 may include a network interface component or another suitable device to interface with the network 980. In further examples, the communication components 964 may include wired communication components, wireless communication components, cellular communication components, and other communication components to provide communication via other modalities. The devices 970 may be another machine or any of a wide variety of peripheral devices (e.g., a peripheral device coupled via a universal serial bus (USB)).

Executable Instructions and Machine Storage Medium

The various memories (e.g., 930, 932, 934, and/or memory of the processor(s) 910) and/or the storage unit 936 may store one or more sets of instructions and data structures (e.g., software) embodying or utilized by any one or more of the methodologies or functions described herein. These instructions, when executed by the processor(s) 910, cause various operations to implement the disclosed embodiments.

As used herein, the terms "machine-storage medium," "device-storage medium," and "computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks. The terms machine-storage media, computer-storage media, and device-storage media specifically exclude carrier waves, modulated data signals, and other such media, at least some of which are covered under the term "signal medium" discussed below.

Transmission Medium

In various example embodiments, one or more portions of the network 980 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 980 or a portion of the network 980 may include a wireless or cellular network, and the coupling 982 may be a Code Division Multiple Access (CDMA) connection, a Global System for Mobile communications (GSM) connection, or another type of cellular or wireless coupling. In this example, the coupling 982 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long range protocols, or other data transfer technology.

The instructions 916 may be transmitted or received over the network 980 using a transmission medium via a network interface device (e.g., a network interface component included in the communication components 964) and utilizing any one of a number of well-known transfer protocols (e.g., hypertext transfer protocol (HTTP)). Similarly, the instructions 916 may be transmitted or received using a transmission medium via the coupling 972 (e.g., a peer-to-peer coupling) to the devices 970. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 916 for execution by the machine 900, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A system comprising:
   one or more processors of a machine; and
   a computer storage medium storing instructions, which when executed by the machine, cause the machine to perform operations comprising:
   accessing a routing topology of an integrated circuit (IC) design, the routing topology including a tree structure having a plurality of nodes;
   extracting, from the tree structure, a first original subtree corresponding to a first node group that includes a first set of nodes, the first set of nodes including a first node and one or more nodes connected to the first node;
   generating a first horizontal spine subtree based on the first original subtree;
   generating a first vertical spine subtree based on the first original subtree;
   selecting a first ideal subtree from the first original subtree, the first vertical spine subtree, and the first horizontal spine subtree based on a result of an evaluation of the first original subtree, the first vertical spine subtree, and the first horizontal spine subtree in accordance with a routing score function that includes one or more routing score variables;
   modifying the routing topology in accordance with the first ideal subtree, the modifying of the routing topology resulting in a refined routing topology; and
   storing the refined routing topology in a database.

2. The system of claim 1, wherein the operations further comprise:
   extracting, from the tree structure, a second original subtree corresponding to a second node group comprising a second set of nodes, the second set of nodes including a second node and one or more nodes connected to the second node;
   generating a second horizontal spine subtree based on the second original subtree;
   generating a second vertical spine subtree based on the second original subtree;
   selecting a second ideal subtree from the second original subtree, the second vertical spine subtree, and the second horizontal spine subtree based on an evaluation of the second original subtree, the second vertical spine subtree, and the second horizontal spine subtree in accordance with the routing score function; and
   reconnecting the second set of nodes in accordance with the second ideal subtree.

3. The system of claim 2, wherein the operations further comprise:
   determining a breadth-first search (BFS) traversal order for the tree structure; and
   traversing the tree structure from the first node to the second node based on the BFS traversal order.

4. The system of claim 1, wherein the one or more routing score variables include at least one of wire length, latency, and power.

5. The system of claim 1, wherein the evaluation of the first original subtree, the first vertical spine subtree, and the first horizontal spine subtree includes computing a routing score value for each of the subtrees, the routing score value corresponding to at least one of a wire length, a latency, and a power.

6. The system of claim 5, wherein the evaluation of the first original subtree in accordance with the routing score function includes computing a product of the routing score value for the first original subtree and a user-supplied tuning parameter.

7. The system of claim 1, wherein the evaluation of the first original subtree, the first vertical spine subtree, and the first horizontal spine subtree in accordance with the routing score function comprises:
   determining a first wire length corresponding to the first original subtree;
   determining a second wire length corresponding to the first vertical spine subtree;

determining a third wire length corresponding to the first horizontal spine subtree; and comparing the first, second, and third wire lengths to determine a minimum wire length for the first node group;

wherein the selecting of the first ideal subtree is based on the minimum wire length for the first node group.

8. The system of claim 1, wherein the evaluation of the first original subtree, the first vertical spine subtree, and the first horizontal spine subtree in accordance with the routing score function comprises:

determining a first latency corresponding to the first original subtree;

determining a second latency corresponding to the first vertical spine subtree;

determining a third latency corresponding to the first horizontal spine subtree; and comparing the first, second, and third latencies to determine a minimum latency for the first node group;

wherein the selecting of the first ideal subtree is based on the minimum latency for the first node group.

9. The system of claim 1, wherein the generating of the first vertical spine subtree comprises:

comparing a horizontal position of the first node with horizontal positions of a rightmost and a leftmost node in the first original subtree;

determining a horizontal position of a first and second endpoint of a spine connector based on a result of the comparing;

determining a vertical position of the first endpoint of the spine connector based on a vertical position of a topmost node in the first original subtree;

determining a vertical position of the second endpoint of the spine connector based on a vertical position of a bottommost node in the first original subtree; and creating one or more horizontal connectors to connect each node of the first set of nodes to the spine connector.

10. The system of claim 9, wherein the comparing the horizontal position of the first node with horizontal positions of the rightmost and the leftmost node in the first original subtree comprises:

determining whether the horizontal position of the rightmost node is the same as the horizontal position of the first node; and determining whether the horizontal position of the leftmost node is the same as the horizontal position of the first node.

11. The system of claim 1, wherein the generating of the first horizontal spine subtree comprises:

comparing a vertical position of the first node with vertical positions of a topmost and a bottommost node in the first original subtree;

determining a vertical position of a first and second endpoint of a spine connector based on a result of the comparing;

determining a horizontal position of the first endpoint of the spine connector based on a horizontal position of a rightmost node in the first original subtree;

determining a horizontal position of the second endpoint of the spine connector based on a horizontal position of a leftmost node in the first original subtree; and creating one or more vertical connectors to connect each node of the first set of nodes to the spine connector.

12. The system of claim 1, wherein the operations further comprise performing detailed routing for the IC design based on the refined routing topology.

13. A method comprising:

accessing a routing topology of an integrated circuit (IC) design, the routing topology including a tree structure having a plurality of nodes;

extracting, from the tree structure, a first original subtree corresponding to a first node group that includes a first set of nodes, the first set of nodes including a first node and one or more nodes connected to the first node;

generating a first horizontal spine subtree based on the first original subtree;

generating a first vertical spine subtree based on the first original subtree;

computing, using one or more processors of a machine, a routing score value for each of the first original subtree, the first vertical spine subtree, and the first horizontal spine subtree using a routing score function that includes one or more routing score variables;

selecting a first ideal subtree from the first original subtree, the first vertical spine subtree, and the first horizontal spine subtree based on evaluating the routing score values of the first original subtree, the first vertical spine subtree, and the first horizontal spine subtree;

modifying the routing topology in accordance with the first ideal subtree, the modifying of the routing topology resulting in a refined routing topology; and storing the refined routing topology in a database.

14. The method of claim 13, further comprising:

determining a breadth-first search (BFS) traversal order for the tree structure; and traversing the tree structure from the first node to a second node based on the BFS traversal order.

15. The method of claim 14, further comprising:

extracting, from the tree structure, a second original subtree corresponding to a second node group comprising a second set of nodes, the second set of nodes including the second node and one or more nodes connected to the second node;

generating a second horizontal spine subtree based on the second original subtree;

generating a second vertical spine subtree based on the second original subtree;

selecting a second ideal subtree from the second original subtree, the second vertical spine subtree, and the second horizontal spine subtree based on an evaluation of the second original subtree, the second vertical spine subtree, and the second horizontal spine subtree in accordance with the routing score function; and reconnecting the second set of nodes in accordance with the second ideal subtree.

16. The method of claim 13, wherein the evaluating of the first original subtree, the first vertical spine subtree, and the first horizontal spine subtree includes computing a routing score value for each of the subtrees, the routing score value corresponding to at least one of a wire length, a latency, and a power.

17. The method of claim 16, wherein the evaluating of the first original subtree in accordance with the routing score function includes computing a product of the routing score value for the first original subtree and a user-supplied tuning parameter.

18. The method of claim 13, wherein the generating of the first vertical spine subtree comprises:

comparing a horizontal position of the first node with horizontal positions of a rightmost and a leftmost node in the first original subtree;

determining a horizontal position of a first and second endpoint of a spine connector based on a result of the comparing;

determining a vertical position of the first endpoint of the spine connector based on a vertical position of a topmost node in the first original subtree;

determining a vertical position of the second endpoint of the spine connector based on a vertical position of a bottommost node in the first original subtree; and creating one or more horizontal connectors to connect each node of the first set of nodes to the spine connector.

19. The method of claim 13, wherein the generating of the first horizontal spine subtree comprises:

comparing a vertical position of the first node with vertical positions of a topmost and a bottommost node in the first original subtree;

determining a vertical position of a first and second endpoint of a spine connector based on a result of the comparing;

determining a horizontal position of the first endpoint of the spine connector based on a horizontal position of a rightmost node in the first original subtree;

determining a horizontal position of the second endpoint of the spine connector based on a horizontal position of a leftmost node in the first original subtree; and creating one or more vertical connectors to connect each node of the first set of nodes to the spine connector.

20. A system comprising:

one or more processors of a machine; and a computer storage medium storing instructions, which when executed by the machine, cause the machine to perform operations comprising:

accessing a routing topology of an integrated circuit (IC) design, the routing topology including a tree structure having a plurality of nodes;

extracting, from the tree structure, an original subtree corresponding to a node group that includes a set of nodes, the set of nodes including a root node and one or more nodes connected to the root node;

creating one or more spine subtrees based on the original subtree;

evaluating the original subtree and the one or more spine subtrees in accordance with a routing score function that includes one or more routing score variables;

selecting an ideal subtree from the first original subtree and the one or more spine subtrees based on a result of the evaluating;

modifying the routing topology in accordance with the ideal subtree, the modifying of the routing topology resulting in a refined routing topology; and routing the IC design based on the refined routing topology.

\* \* \* \* \*